US009588145B2

(12) United States Patent
Honjo et al.

(10) Patent No.: US 9,588,145 B2
(45) Date of Patent: Mar. 7, 2017

(54) ELECTRIC POWER MANAGEMENT APPARATUS AND ELECTRIC POWER MANAGEMENT METHOD

(71) Applicant: SONY CORPORATION, Tokyo (JP)

(72) Inventors: Ryoki Honjo, Kanagawa (JP); Taro Tadano, Chiba (JP)

(73) Assignee: SONY CORPORATION, Tokyo (JP)

( * ) Notice: Subject to any disclaimer, the term of this patent is extended or adjusted under 35 U.S.C. 154(b) by 696 days.

(21) Appl. No.: 13/668,891

(22) Filed: Nov. 5, 2012

(65) Prior Publication Data

US 2013/0127443 A1    May 23, 2013

(30) Foreign Application Priority Data

Nov. 17, 2011 (JP) .................. 2011-251243

(51) Int. Cl.
*G01R 11/63*    (2006.01)
*G01R 11/56*    (2006.01)
*G06Q 50/06*    (2012.01)
*H02J 3/00*    (2006.01)
*G06Q 10/00*    (2012.01)
*H02J 1/00*    (2006.01)

(52) U.S. Cl.
CPC ............. *G01R 11/56* (2013.01); *G06Q 50/06* (2013.01); *H02J 3/00* (2013.01); *G06Q 10/00* (2013.01); *G06Q 2220/00* (2013.01); *H02J 1/00* (2013.01); *H02J 2003/003* (2013.01); *H02J 2003/007* (2013.01); *Y02E 60/76* (2013.01); *Y04S 10/54* (2013.01); *Y04S 40/22* (2013.01)

(58) Field of Classification Search
CPC ............. G06Q 10/00; G06Q 2220/00; G06Q 2230/00; H02J 1/00
USPC ...................................... 324/103 R
See application file for complete search history.

(56) References Cited

U.S. PATENT DOCUMENTS

| | | | |
|---|---|---|---|
| 6,577,961 B1 * | 6/2003 | Hubbard ............ | G01R 19/2513 702/60 |
| 6,987,955 B1 * | 1/2006 | Sapozhnykov ....... | H04W 52/24 370/206 |
| 7,221,712 B1 * | 5/2007 | Schwartzman .... | H04N 7/17309 348/E17.003 |
| 2004/0153170 A1 * | 8/2004 | Santacatterina et al. ......... | 700/1 |
| 2010/0332876 A1 * | 12/2010 | Fields et al. .................. | 713/323 |
| 2011/0051325 A1 * | 3/2011 | Kawasaki ..................... | 361/631 |
| 2011/0055036 A1 * | 3/2011 | Helfan .................. | G06Q 30/04 705/26.1 |
| 2011/0074152 A1 * | 3/2011 | Yasugi ................. | F03D 7/0284 290/44 |
| 2011/0121791 A1 * | 5/2011 | Basham .................... | H02J 3/14 320/162 |

(Continued)

*Primary Examiner* — Jermele M Hollington
*Assistant Examiner* — Temilade Rhodes-Vivour
(74) *Attorney, Agent, or Firm* — Chip Law Group (57) ABSTRACT

Disclosed herein is an electric power management apparatus including: an electric power measurement block configured to measure an electric power consumption amount of an electric power consumer; and an electric power comparison block configured to make a comparison between an electric power consumption amount measured by the electric power measurement block and an electric power demand forecast amount indicative of a forecast amount of an electric power demand of the electric power consumer.

9 Claims, 7 Drawing Sheets

(56) References Cited

U.S. PATENT DOCUMENTS

| | | | |
|---|---|---|---|
| 2011/0251933 A1* | 10/2011 | Egnor | G06Q 50/06 705/30 |
| 2011/0276209 A1* | 11/2011 | Suganuma et al. | 701/22 |
| 2012/0131363 A1* | 5/2012 | Hsu | 713/320 |
| 2012/0330472 A1* | 12/2012 | Boot | 700/291 |

* cited by examiner

FIG.7

ELECTRIC POWER MANAGEMENT APPARATUS AND ELECTRIC POWER MANAGEMENT METHOD

BACKGROUND

The technology disclosed herein relates to an electric power management apparatus and an electric power management method.

In the past, electric power supply to electric power customers had been exclusively carried out by electric power companies in many countries. However, recently, the principle of competition is being introduced in the electric power industry. Participation of utilities other than electric power companies into the power retailing industry, and electricity futures trading are being realized or promoted in order to further enhance the efficiency of the electric power business and supply electric power at lower prices.

In electricity futures trading, for example, the amount of electric energy that will be required is estimated, and the electric power of the next day or 24 hours is traded in the power market. Accordingly, in order for the entities of electric power retailing and electricity futures trading to dominantly execute electric power trading and produce big profits, the forecast of electric power demand needs to be done accurately.

As a technology for forecasting electric power demand, Japanese Patent Laid-open No. Hei 5-18995 (Patent Document 1) discloses a total electric power demand forecasting apparatus which forecasts the total electric power demand by taking in weather variables including past temperatures and humidity and data on total electric power demand, and carrying out learning using a neural network.

SUMMARY

The total electric power demand forecasting apparatus cited in Patent Document 1 forecasts electric power demand based on weather data and total electric power demand of the past. Because electric power demand is closely related with such weather data as average temperature and humidity, electric power demand can be forecast with some accuracy by use of weather data.

However, since electric power demand is also closely related with factors other than weather data it is necessary to take these other factors into consideration for a more correct forecast of electric power demand. In particular, it is difficult to accurately forecast a future electric power demand in general homes because the electric power demand is irregular.

It is therefore desirable to provide an electric power management apparatus and an electric power management method that can produce an electric power demand forecast with high accuracy.

In carrying out the invention and according to one mode thereof, a first technology is an electric power management apparatus. This electric power management apparatus has an electric power measurement block configured to measure an electric power consumption amount of an electric power consumer; and an electric power comparison block configured to make a comparison between an electric power consumption amount measured by the electric power measurement block and an electric power demand forecast amount indicative of a forecast amount of an electric power demand of the electric power consumer.

In carrying out the invention and according to another mode thereof, a second technology is an electric power management method. This electric power management method has measuring an electric power consumption amount of an electric power consumer; and comparing a measured electric power consumption amount with an electric power demand forecast amount.

According to the technology disclosed herein, accurate electric power demand forecasting is provided.

DETAILED DESCRIPTION OF THE PREFERRED EMBODIMENTS

Embodiments of the present technology will be described in further details with reference to the accompanying drawings. It should be noted that the technology disclosed herein is not limited to the embodiments described below. The description will be made in the following order:

1. Embodiment
   1-1. Outline of Electric Power Trading
   1-2. Configuration of Electric Power Management Apparatus
   1-3. Configuration of HEMS Including the Electric Power Management Apparatus
   1-4. Processing by the Electric Power Management Apparatus
2. Variations
1. Embodiment
1-1. Outline of Electric Power Trading First, electric power trading is outlined before describing an embodiment of the present technology. There are two kinds of electric power trading: spot trading (spot market) in which the electric power to be used the next day or the day after the next day or so is traded; and hour-ahead trading (hour-ahead market) in which the electric power to be used that day several hours after is traded.

Spot trading is executed in such a scheme as follows, for example. Traded is the electric power for 24 hours to he delivered next day. Therefore, the day at which the traded electricity will be delivered is the next day. One day is divided by 30 minutes into 48 sections, and the 48 commodities are traded. The bidding for the electric power for the next day takes piece every morning from a.m. 8:00 to a.m. 930 and the transaction is closed at a.m. 9:30. On Fridays, the electric power to be delivered the next day (Saturday), the day after the next day (Sunday), and three days later (Monday) is traded.

Bidding is executed by presenting the price and amount. The transaction and the delivery are made in units of 1000 kwh, for example. The price per 1 kwh is set in sens, that is, one-hundredth of a yen. For example, if the deal is set at 7.48 yen/kwh for a delivery of 1000 kwh, the trading value will be "1000 kwh×7.48 yen/kwh=7480 yen."

Figure 1:
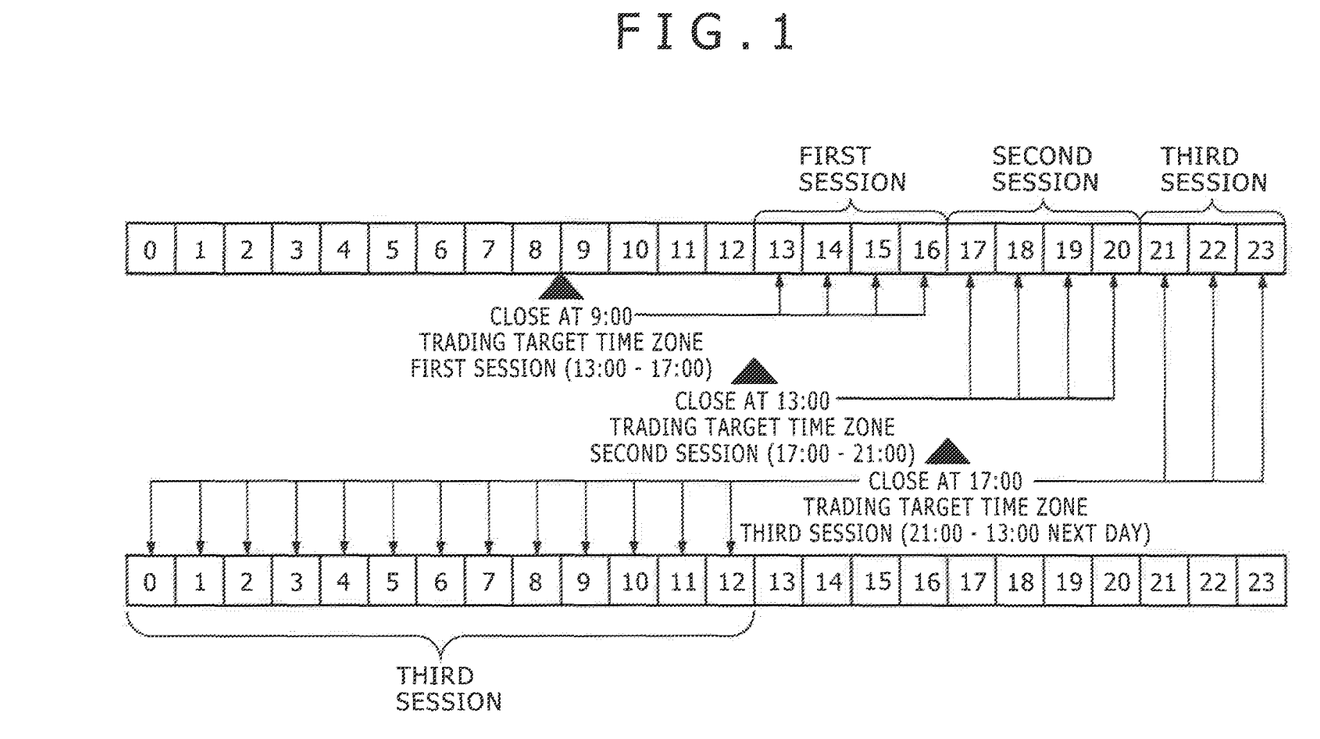
FIG. 1 is a diagram illustrating a scheme of electric power trading.

Next, hour-ahead trading is described with reference to FIG. 1, Hour-ahead trading is carried out in the following scheme for example. Traded is the electric power to be used on the day of the transaction. The trading sessions close at 9:00, 13:00, and 17:00. in the transaction closed at 9:00, the electricity traded is for the time zone of 13:00 to 17:00 (the first session). The electricity traded in the trading closed at 13:00 is for the time zone of 17:00 to 21:00 (the second session) The electricity traded in the transaction closed at 17:00 is for the time zone of 21:00 to 13:00 next day (the third. session). In the transaction closed at 9:00, the electric power to be used from 1300, namely, four hours later, to 17:00 is traded. Therefore, this scheme is referred to as "four-hours-ahead trading (four-hours-ahead market)." As with spot transaction, this transaction is made in units of 30 minutes.

It should be noted that the above-mentioned electric power transaction scheme is only an example, and the scheme of electric power trading is not limited to this. For example, in the spot transaction, the electricity to be used in the day after the next day may be traded. The closing times of transaction are not limited to 9:00, 13:00, and 17:00. The transaction unit may not be 30 minutes but any other length of time, one hour, for example. Any scheme may be used as long as it is one for trading electric power to be used in the future beforehand. A scheme that includes electric power selling in addition to electric power buying is also possible.

1-2. Configuration of Electric Power Management Apparatus

Figure 2:
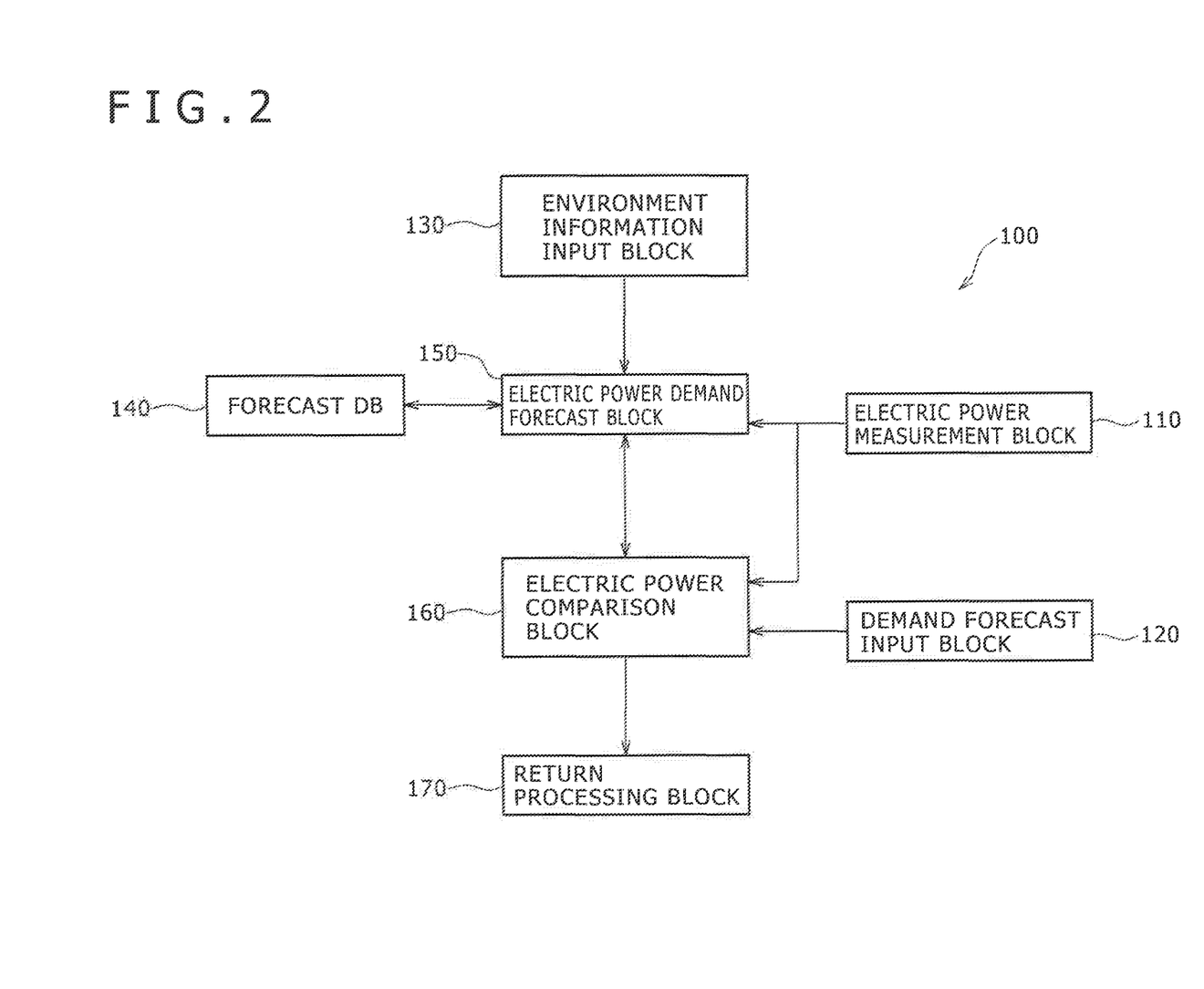
FIG. 2 is a block diagram illustrating an example of the configuration of an electric power management apparatus.

FIG. 2 shows a block diagram illustrating an exemplary configuration of an electric power management apparatus 100 of an embodiment of the present technology. The electric power management apparatus 100 includes an electric power measurement block 110, demand forecast input block 120, environment information input block 130, forecast database 140, electric power demand forecast block 150, electric power comparison block 160, and return processing block 170.

The electric power measurement block 110 is installed at such places as a consumer's house to measure the electric power consumption amount of the consumer in that place. For example, the electric power measurement block 110 has the function of an ammeter and the function of a voltmeter to measure the electric power at the house at which it is installed. The electric power measurement block 110 constantly measures the electric power consumption amount of the building and transmits the data to the electric power demand forecast block 150 and the electric power comparison block 160. It should be noted that the "consumer" is here the user of electric power, such as an individual, family, group, corporation, or organization that is subject to the electric power management of the electric power management apparatus 100 of the embodiment of the technology disclosed herein.

The demand forecast input block 120 is input means through which a consumer inputs his or her forecast of electric power consumption amount. The demand forecast input block 120 is made up of, for example, a display apparatus such as a display and a touch screen integrated with the display apparatus or buttons. The demand forecast input block 120 may be of any configuration as long as a consumer can input an electric power demand forecast amount through it.

When a forecast is input through the demand forecast input block 120, the entered forecast amount is transmitted to the electric power comparison block 160, In the following description, this electric power demand forecast amount which the consumer enters is referred to as a first electric power demand forecast amount.

Figures 3A, 3B:
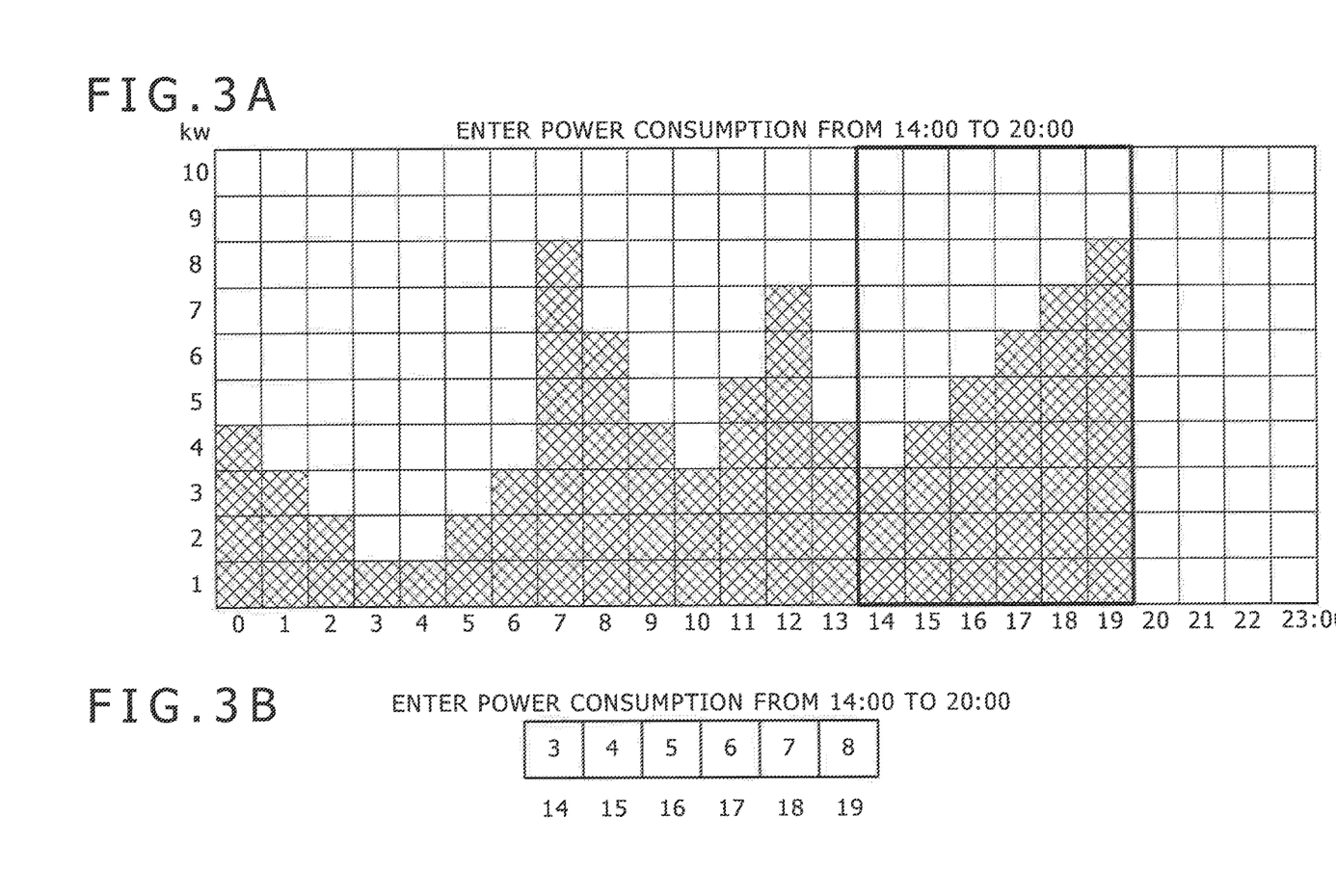
FIGS. 3A and 3B are diagrams illustrating examples of the method of entering an electric power demand forecast amount.

FIGS. 3A and 3B show examples of input screens that are presented to the consumer upon entering of an electric power forecast amount. FIG. 3A shows the input format displayed on the touch screen. The electric power consumption amount is displayed in a bar graph, where the vertical axis indicates power consumption (kw) and the horizontal axis indicates time of day. The area enclosed by thick lines indicates the period of time (hereafter referred to an input, target period) for which the consumer enters the electric power demand forecast amount. The consumer enters the electric power demand forecast amount by touching a box (cell) corresponding to the forecast amount with a finger, for example, in the example shown in FIG. 3A, the consumer forecasts his or her electric power demand amount for every hour from 14:00 to 20:00 and enters the forecast amounts.

The input format is not limited, to ones like that shown in FIG. 3A. As shown in FIG. 3B, it may be one a consumer directly enters values indicating the electric power demand. forecast amounts. In the case of the example of FIG. 3B, the image shown in FIG. 3B is displayed on the display apparatus, and an electric power demand forecast amount is entered through an input device such as buttons. In FIG. 3B, the time zones constituting the input target period correspond to the input digit number.

Any input format is available as long as it allows input of values indicative of electric power demand forecast amounts. In addition, numbers after the decimal point may he entered, for example, like 1.2 kwh. The length of the time zones is not limited. to one hour; if the input target period is from 14:00 to 20:00 and the input unit is one hour, then the consumer enters six values. If the input target period is from 14:00 to 20:00 and the input unit is 30 minutes, then the consumer enters 12 values. The time zones can be set in accordance with the scheme of electric power trading.

The input target period is not limited to six hours from 14:00 to 20:00 as described above. It may be a different period of time, and the range of the period. may be longer such as 12 hours or 24 hours. However, the longer the input target period, the more troublesome the inputting of the electric power demand forecast becomes. Because the consumer may stop inputting, the input target period should be of such a length that the consumer can continue to input in a long term.

The environment information input block 130 acquires environment information and enters the obtained environment information into the electric power management apparatus 100. The environment information includes weather types such as fine, cloudy, rain, and snow and weather information such as temperature, humidity, precipitation, wind force, and sunlight hours. The environment information input block 130 may acquire, as the environment information, the weather information provided by the Meteorological Agency or other organization via the Internet or other network. Alternatively, the environment information input block 130 may acquire weather information from various instruments such as a thermometer, hygrometer, rain gauge, and anemometer that are connected to the environment information input block 130. Also, the environment information input block 130 may acquire the weather information from a weather information database provided by a private business. The obtained environment information is supplied to the electric power demand forecast block 150.

The forecast database 140 includes a mass storage medium and a control block for controlling the mass storage medium.

The forecast database 140 stores, for example, the consumer's past electric power consumption amount, environment information, and dates in relation to one another. Referring to the normal-time demand database, the past electric power consumption amount and the environment at that time including the weather can be understood.

The electric power demand forecast block 150 forecasts the electric power demand of the consumer. The electric power demand forecast block 150 includes a CPU (Central Processing Unit), RAM (Random Access Memory), and ROM (Read Only Memory). In the RUM, programs read by the CPU are stored. The RAM serves as a work memory for the CPU. The CPU executes the programs stored in the ROM and carries out electric power demand forecast processing.

The electric power demand forecast block 150 calculates the electric power demand forecast amount to be used in the period other than the input target period for which the consumer has inputted the first electric power demand forecast amount before the transaction target day of the spot transaction. For example, if the consumer has entered the first electric power demand forecast amount to be used from 14:00 to 20:00, the electric power demand forecast block 150 finds the electric power demand forecast amounts for 0:00 to 14:00 and 20:00 to 24:00. The first electric power demand forecast amount entered by the consumer and the electric power demand forecast amount calculated by the electric power demand forecast block 150 are transmitted to an external power-associated entity or other entity, and the electric power trading is made based on the electric power demand forecast amounts. This electric power demand forecast amount is hereafter referred to as a second electric power demand forecast amount.

The computation of the second electric power demand forecast amount may be executed by learning using known neural network processing such as the one cited in Patent Document 1, or by an existing learning algorithm or inductive learning. In this computation, the electric power demand forecast block 150 references the past environment information, electric power demand, and so on stored in the forecast database 140. A neural network is an information processing mechanism build by simulating the human brain mechanism for realizing pattern recognition and forecast.

As time passes, more data on electric power consumption amount and environment information are stored in the forecast database 140. This means that the amount of information that can be referred to increases, and therefore the forecast using learning will become more accurate.

Further, based on the amount of electric power consumed in the very day of the transaction target day the day the traded electricity is delivered), which is supplied from the electric power measurement block 110, on the transaction target day, the electric power demand forecast block 150 forecasts the electric power demand amount to be used within the input target period. For example, the electric power demand forecast block 150 calculates the electric power demand forecast amount for the input target period from the rate of change (differential value) of the amount of electric power consumed in the transaction target day until the input target period. The calculated electric power demand forecast amount is referred to as a third electric power demand forecast amount.

Incidentally, although not shown, the electric power management apparatus 100 has a clock function and calendar information so that it can obtain and perceive information of the dates and hours of the present, the past, and the future.

The electric power comparison block 160 includes a CPU, RAM and ROM. The CPU executes various processes based on programs stored in the ROM, thereby carrying out the processes as the electric power comparison block 160.

The electric power comparison block 160 makes a comparison between the first electric power demand forecast amount and the third electric power demand forecast amount. The first electric power demand forecast amount is the electric power demand forecast amount entered by the consumer. The third electric power demand is the electric power demand forecast amount for the input target period that is calculated based on the amount of electric power consumed in the transaction target day which is supplied from the electric power measurement block 110.

Figure 4A:
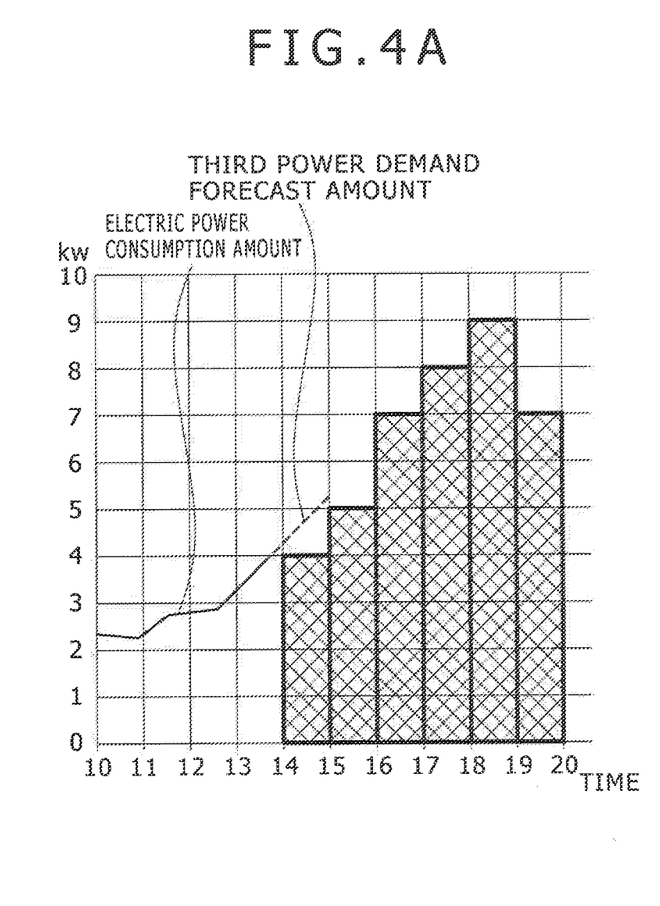
FIGS. 4A and 4B are diagrams illustrating electric power comparison in details.
Figure 4B:
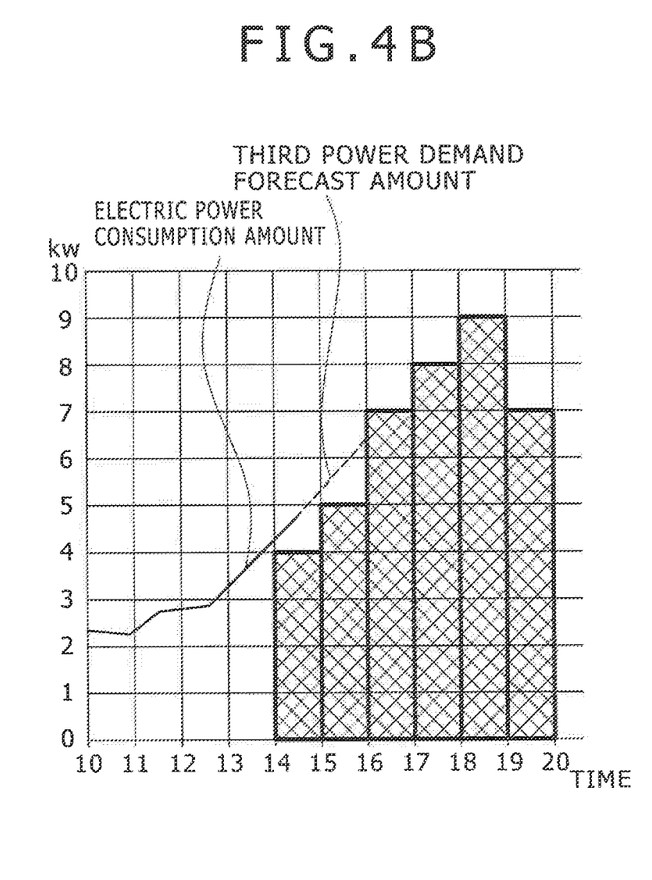

The following describes this comparison with reference to FIGS. 4A and 4B. FIGS. 4A and 4B show electric power consumption amounts, the third electric power demand forecast amounts obtained by the electric power demand forecast block 150, and the first electric power demand forecast amounts obtained by the consumer, respectively, with the vertical axes being electric power consumption amount and the horizontal axes being time. It should be noted that the times and the electric power amounts shown in these figures are illustrative only.

The solid lines shown in FIGS. 4A and 4B are indicative of electric power consumption amounts. The dashed lines in these figures are indicative of the third electric power demand forecast amounts computed by the electric power demand forecast block 150. The bars in these figures are indicative of the first electric power demand forecast amounts entered by the consumer.

Immediately before the input period, the electric power demand forecast block 150 obtains the third electric power demand forecast amount in the input period from the variation ratio (the differential value of electric power consumption amount) of an electric power consumption amount before the input period. Each dashed line shown in FIGS. 4A and 4B are indicative of the third electric power demand forecast amounts thus obtained. The obtained third electric power demand forecast amounts are supplied, to the electric power comparison block 160.

Then, the electric power comparison block 160 makes a comparison between the first electric power demand forecast amount and the third electric power demand forecast amount. If there is found a difference between the first, electric power demand forecast amount and the third electric power demand forecast amount, then the electric power comparison block 160 transmits the notification of the difference to the consumer.

For this notification, a method may be employed in which a message such as "from 14:00 to 1500, your electric power consumption amount will get larger by 2 kw than the your forecast" or "from 14:00 to 15:00, your electric power consumption amount will get smaller by 1 kw than your forecast" for example is given in an image for example. This image may be displayed on a display apparatus making up the demand forecast input block 120, for example. It is also practicable to sound messages from a loudspeaker, for example. This display apparatus and this loudspeaker, for example, are equivalent to a notification block cited in the scope of claims herein.

If a match is found between the electric power consumption amount and the first electric power demand forecast amount, profit return processing is executed for the consumer, details thereof to be described later. Therefore, it can be supposed that, by executing the notification as described above, the consumer tries to adjust the electric power consumption amount by turning off the power to electric appliances in order to make the electric power consumption amount be brought to the first electric power demand forecast amount entered by the consumer. Thus, the notification gives the consumer an incentive for advantageously adjusting the electric power consumption amount.

It should be noted that, if a match is found between the first electric power demand forecast amount and the third electric power demand forecast amount, the notification thereof may also be transmitted to the consumer. Consequently, receiving this notification, the consumer is able to know that the electric power usage status at the time of the arrival of the notification is to be continued.

A sequence of processing operations, namely, the forecast and comparison of the electric power demand forecast amounts and the notification thereof, may be carried out for each section of the input period. Therefore, as shown in FIG. 4A, electric power demand forecast from 14:00 to 15:00 is executed on the basis of an electric power consumption amount immediately up to 14:00 for example; then, as shown in FIG. 4B, electric power demand forecast from 15:00 to 16:00 is executed on the basis of an electric power consumption amount immediately up to 15:00. This is continued for the input period. Consequently, accurate electric power demand forecast can be executed.

In addition, the electric power comparison block 160 makes a comparison between the first electric power demand forecast amount entered by the consumer and the electric power consumption amount obtained by the electric power measurement block 110 to determine whether these amounts match each other. If a match is found between the first electric power demand forecast amount and the electric power consumption amount, predetermined profit return processing is executed for the consumer, details thereof being described later.

The comparison between the first electric power demand forecast amount and the electric power consumption amount is carried out for each of the time zones making up the input period. For example, if the input period is set to 6 hours, from 14:00 to 20:00, and six numerals are entered by the consumer with one hour as one value, the whether or not a match is found is determined for each numeral (namely, for each time zone).

The determination that there is a match between each individual value making up the first electric power demand forecast amount and the electric power consumption amount may be that the value is found in the proximity of a predetermined range, in addition to that the value is found exactly matching. For example, if ±0.5 kw is a proximity range and the electric power demand forecast amount within one hour from 14:00 to 1:500 in the input period is forecast to be 2 kw, then a match may be determined if the electric power consumption amount is in a range from 2.5 kw to 1.5 kw.

Determination that there is a match between the first electric power demand forecast amount all over the input period and the electric power consumption amount is made in any of various situations. For example, if the consumer enters six numerals with one hour as one value with the input period being six hours from 14:00 to 20:00, then a match is determined when all six numerals match. It is also practicable to do match determination if five of the six numerals match or four of the six numerals match, for example.

In addition, it is practicable to do match determination if the electric power demand forecast amount of a time zone having a higher priority matches, by prioritizing the time zones included in the input period. The comparison results obtained through the electric power comparison block 160 are supplied to the return processing block 170.

Further, the electric power comparison block 160 makes a comparison between the second electric power demand forecast amount and the electric power consumption amount supplied from the electric power measurement block 110. As described above, the second electric power demand forecast amount denotes an electric power demand forecast amount in a time zone other than the input period in which the first electric power demand forecast amount was entered by the consumer, the second electric power demand forecast amount being computed by the electric power demand forecast block 150.

The comparison results obtained through the electric power comparison block 160 are fed back to the electric power demand forecast block 150 for use in the learning in the electric power demand forecast block 150 and are stored in the forecast database 140. Use of the fed back comparison results for the later electric power demand forecasting based on the learning in the electric power demand forecast block 150 allows the enhancement of the accuracy in the electric power demand forecasting in the electric power demand forecast block 150.

The return processing block 170 executes predetermined. return processing on the basis of the comparison results of through the electric power comparison block 160. The comparison results to be supplied to the return processing block 170 denote the results of comparisons between the first electric power demand forecast amount entered by the consumer and the electric power consumption amount. The return processing denotes the processing of providing a predetermined profit to the consumer who matched the first electric power demand forecast amount with the actual electric power consumption amount.

Various types of returns methods to be executed by the return processing block 170 are possible. One is points rewarding, for example. Points rewarding is realized by increasing or decreasing points data through the return processing block 170 on the points database (not shown) in which the data representative of points is held, for example.

When rewarded points have been accumulated in a predetermined amount, the accumulated points may be exchanged for various goods and services. The goods and services provide effects or satisfaction of some kind. materially or mentally. The goods herein denote tangibles, while services denote intangibles that do not last after being traded. The exchange of goods and services is carried out by entities that use the electric power management apparatus associated with the technology disclosed herein.

Goods include commodities, tradable coupons, and so on. To be more specific, commodities include everyday sundries, household appliances, electronic devices, foods, and so on. Tradable coupons include gift certificates, beer coupons, travel coupons, book coupons, air tickets, event entrance tickets, and so on. Services include leisure services, medical services, lodging services, education services, transportation services, dine-out services, consultation services, and so on in addition, points may be exchanged to points of other points rewarding services such as air mileage services. It should be rioted that the goods and services are not limited to those mentioned above; any other goods and services are applicable as far as economically tradable.

Another possible returns method the cashback of electrical fees to the consumer. The cashback of electrical fees is realized by executing bank transfer processing in which all or part of the electrical fee for the use of electricity by the consumer is paid into the bank account of the consumer. The bank transfer processing can be carried out by executing an existing bank transfer processing software program.

In addition to the cashback of electrical fees, money may be paid as a reward. This can also be carried out by executing an existing bank transfer software program. It should be noted however that the returns to the consumer is not limited to rewarding of points or paying of money; the returns may also be realized by directly providing goods or services mentioned above to the consumer, for example.

As described above, in the present embodiment, the consumer forecasts his or her electric power demand consumption and enters the first electric power demand forecast amount, thereby making a comparison between the entered first electric power demand forecast amount and an actual electric power consumption amount. If a match is found, then a resultant profit is returned to the consumer.

The electric power management apparatus 100 is configured as described above. In the technology disclosed herein, the consumer enters his or her electric power demand forecast amount as the information for spot transactions. Then, if there is a match between the entered electric power demand forecast amount and an actual electric power consumption amount, predetermined profit return processing is executed for the consumer. Consequently, this novel configuration allows the consumer to enter electric power demand forecast amounts as if the consumer plays number guess game or number selection lottery. This motivates the consumer to enter electric power demand forecast amounts over a long time.

It should be noted that the electric power demand forecast block 150, the electric power comparison block 160, and so on are realized not only by the execution of software programs but also by hardware members having corresponding functions, these members being combined into dedicated apparatuses.

1-3. Configuration of HEMS Including the Electric Power Management Apparatus

Figure 5:
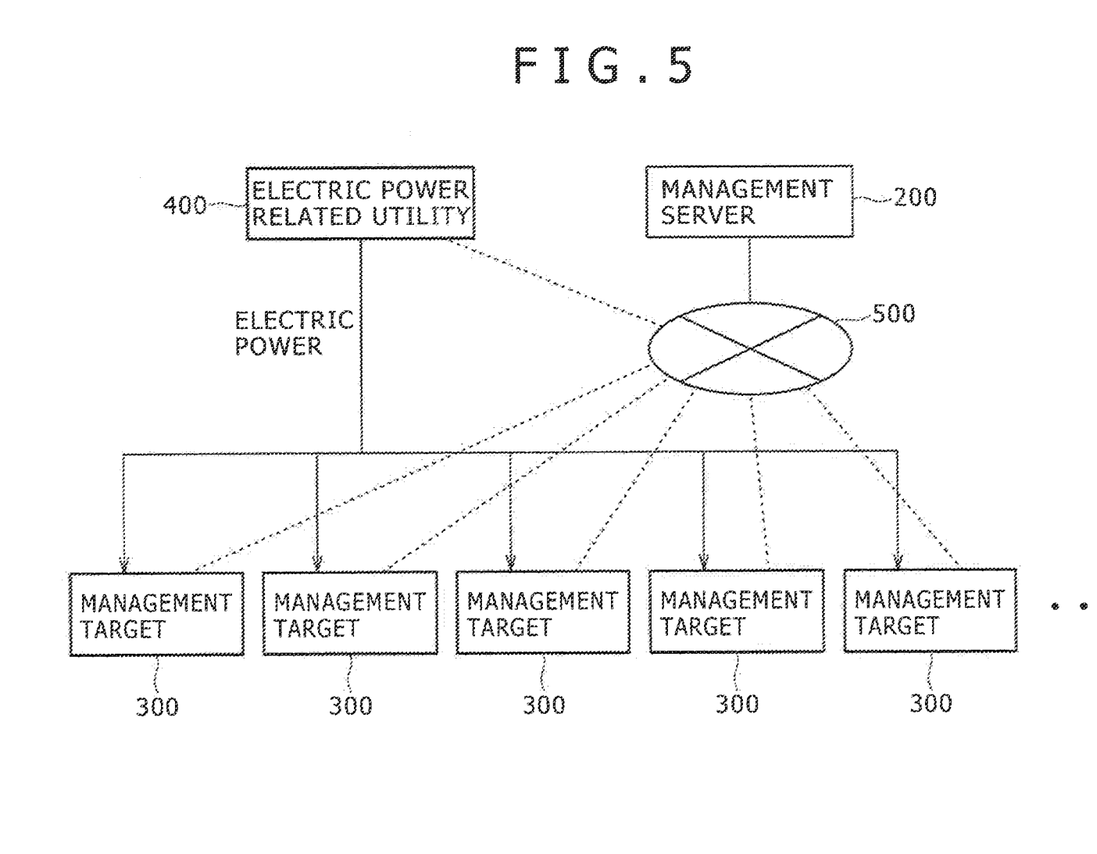
FIG. 5 is a block diagram illustrating an example of the general configuration of a HEMS.
Figure 6:
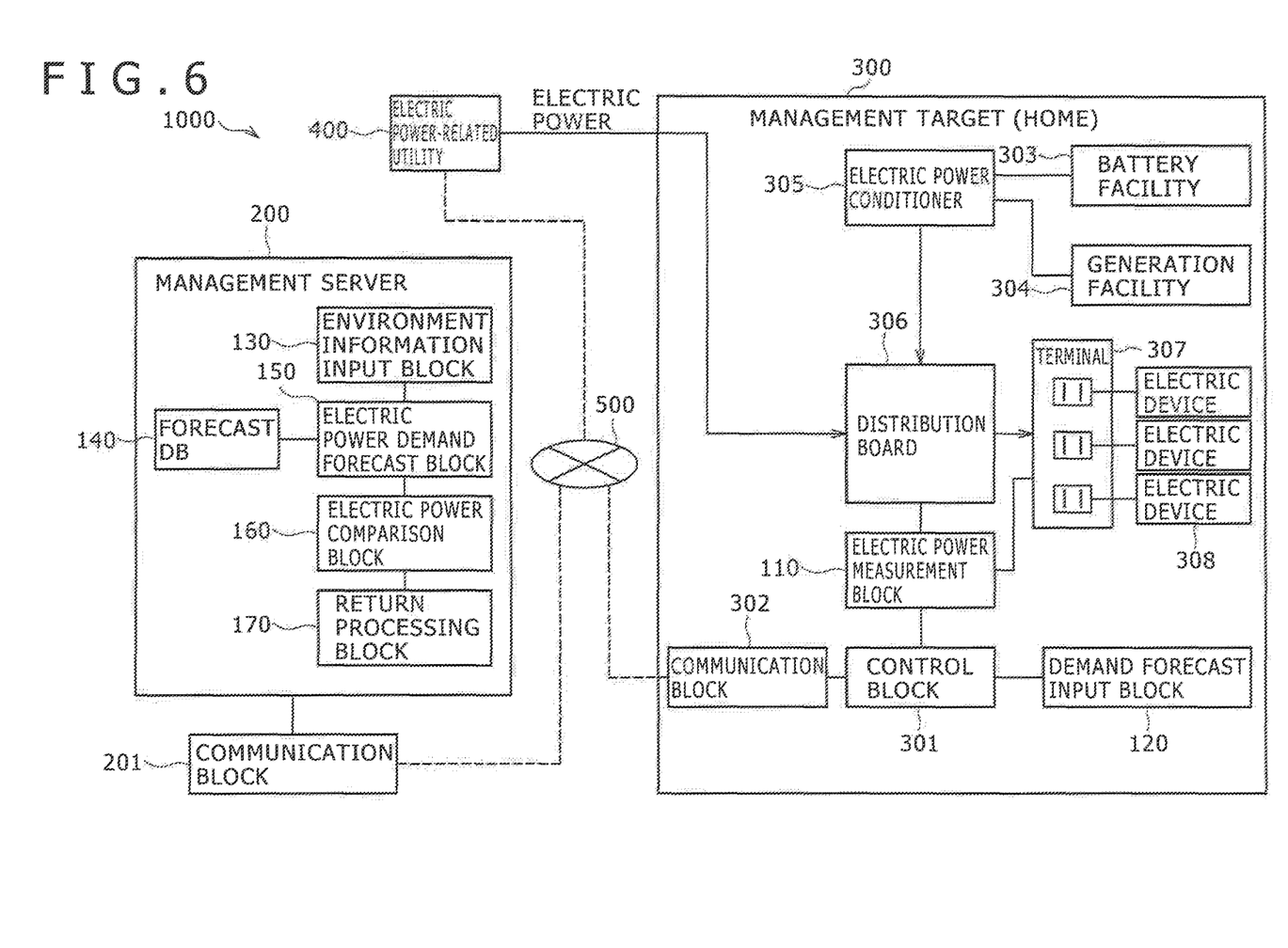
FIG. 6 is a block diagram illustrating an example of the configuration of a HEMS including an electric power management apparatus.

The following describes a HEMS (Home Energy Management System) that has the function of the above-mentioned electric power management apparatus 100 with reference to FIG. 5 and FIG. 6. A HEMS is intended to realize energy saving by enhancing the efficiency of energy usage in common households by use of IT technologies and the like.

Referring to FIG. 5, there is shown a relationship of a management server 200 configured to execute electric power forecasting with two or more management targets 300 and an electric power related utility 400. As shown in FIG. 5, the management server 200 puts two or more management targets 300 under the management, thereby executing electric power management processing on each of the management targets 300. The management server 200 and the management targets 300 are interconnected through the Internet for example. The management target 300 denotes such a building in which the consumer resides or works as home, condominium, office building, or commercial facility, for example. It should be noted that, in what follows, the management target 300 is assumed to be a home in which the consumer resides, for example.

The electric power related. utility includes an electric power company, an electric power generating entity, an electric power transmission entity, an electric power distribution entity, and an electric power retail entity, for example.

The electric power related utility is connected to the management server 200 through a network 500. Electric power demand forecast results obtained by the management server 200 are transmitted to the electric power related utility via the network 500.

Then, the electric power trading based on electric power demand forecast results is executed by electric power retailers included in the electric power related utility, for example. The electric power demand forecast results obtained by the management server 200 may he used by electric power retailers or the electric power company. Further, the electric power is supplied from the electric power related utility to each management target.

Referring to FIG. 6, there is shown an exemplary configuration of a HEMS 1000 made up of a management server 200 and the a home (one example of management targets) subject to a management target 300.

The management server 200 has an electric power comparison block 160 and a return processing block 170 that make up the electric power management apparatus 100.

The configurations of these blocks are substantially the same as those shown in FIG. 2. In this system, a communication block 201 is connected to the management server 200.

The communication block 201 is a communication module and a network interface for executing communication with the management target 300 via a network such as a dedicated line. In the present system, any of communication schemes are available, including wired communication, wireless LAN (Local Area Network), Wi-Fi (tireless Fidelity), 3G line, and so on.

The following describes a home as one example of the management target 300. Each management target has a control block 301, a communication block 302, a battery facility 303, a generation facility 304, an electric power conditioner 305, a distribution board 306, a terminal 307, and an electric device 308. In addition, the management target has an electric power measurement block 110 and a demand forecast input block 120.

The control block 301 is made up of a CPU, a RAM, and a ROM, for example. The ROM stores a program loaded by the CPU. The RAM is used for a work memory of the CPU. The CPU executes various processing operations as instructed by the program stored in the ROM, thereby controlling the functional blocks of the home side of the HEMS 1000 and the entire management target (the home).

The communication block 302 is a communication module and a network interface for executing communication with the management server 200 via a network such as a dedicated line on the basis of a predetermined communication protocol, for example. In the present system, any of communication schemes are available, including wired communication, wireless LAN Local Area Network) , Wi-Fi (Wireless Fidelity), 3G line, and so on. A present/absent flag from the electric power measurement block 110 and an electric power consumption amount obtained by the electric power measurement block 110 are transmitted to the management server 200 through the communication block 302.

The battery facility 303 is made up of a battery module for storing electricity and a battery control block for controlling and managing the battery, for example. Any type of battery module may be used as long as the battery module allows charging/discharging, such as lithium ion secondary battery, lithium ion polymer secondary battery, and nickel-hydrogen battery, for example.

The generation facility 304 generates electric power by converting an energy other than electric power into electric power. It is desirable for the generation facility 304 to be a generation facility based on natural energies or renewable energies that are environment friendly. To be more specific, these environment-friendly energies include solar light, solar heat, wind power, hydraulic power, micro hydraulic power, tidal energy, wave power, water temperature difference, currents, biomass, geothermal heat, sound, and vibration, for example. The generation facility 304 may also be an exercise bike having an electric power generating function or an electric power generating floor that generates electric power when people walk on the floor, for example. It should be noted that the battery facility 303 and the generation facility 304 are not essential to the HEMS.

The electric power conditioner 305 is connected to the battery facility 303 and the generation facility 304. In addition, the electric power conditioner 305 is connected to the distribution board 305

The electric power conditioner 305 has a bidirectional, inverter to execute conversion between direct-current electric power and alternate-current electric power, outputting the obtained electric power to predetermined destinations. In addition, the electric power conditioner 305 is capable of outputting the generated electric power obtained through the generation facility 304 to the battery facility 303. This charges the battery facility 303 with the generated electric power. Further, the electric power conditioner 305 is capable of outputting the generated electric power obtained through the generation facility 304 to the distribution board 306 for use by the consumer. Still further, the electric power conditioner 305 is capable of supplying the electric power from the battery facility 303 to the distribution board 306 for use by the consumer. Yet further, the electric power conditioner 305 is capable of outputting the electric power from the distribution board 306 to the battery facility 303.

The distribution board 306 switches between electric systems. The electric power supplied from the electric power related utility 400 is transmitted to the distribution board 306. The distribution board 306 is connected to the terminal 307. The terminal 307 is connected with two or more electric devices 308. The electric power from the electric power related utility 400, the electric power stored in the battery facility 303, and the electric power generated by the generation facility 304 are transmitted to the electric device 308 through the electric power conditioner 305 and distribution board 306. Consequently, the consumer is able to use the electric device 308.

In a general household, the electric devices 308 include a television receiver, an audio equipment unit, a refrigerator, a microwave oven, a washing machine, an air conditioner, an iron, a hair dryer, an electric stove, an electric warmer, an electric oven, an electric floor warmer, a personal computer, a copying machine, facsimile, a printer, and an electric air cleaner, for example. In stores and commercial facilities, the electric devices 308 further include lighting devices, air conditioning devices, and transportation devices such as an elevator, for example. It should be noted that the electric devices 308 are not limited to the above-mentioned devices and facilities; any devices and facilities that operate on electric power are available as the electric devices 308.

The electric power measurement block 110 measures an electric power consumption amount at the management target 300. The electric power measurement block 110 has a function of an ammeter and a function of a voltmeter, for example, and is connected to the distribution board 306 to measure electric power in the home where the electric power measurement block 110 is arranged, The measured electric power consumption amount is transmitted to the management server 200 through the communication block 302 and the network 500 under the control of the control block 301.

The demand forecast input block 120 provides means through which the consumer enters a first electric power demand forecast amount as described above. The demand forecast input block 120 is made up of a display apparatus such as a display monitor, a touch screen integrally configured with this display apparatus, and an input apparatus such as control buttons, for example.

The input apparatus making up the demand forecast input block 120 may also be used as input means through which the consumer enters various instructions into the HEMS 1000. When an instruction is entered, a control signal is generated accordingly to be outputted to the control block 301. Then, the control block 301 executes computation processing and control operations corresponding to the entered instruction.

The display apparatus making up the demand forecast input block 120 displays, under the control of the control block 301, a current electric power usage status, a past electric power usage status, the type of the electric device 308 in operation, weather, a calendar, and other information.

As described above, the HEMS 1000 having a function of the electric power management apparatus 100 is configured. Electric power demand forecasting, electric power comparison, and return processing are executed on the side of the management server 200. Consequently, the processing associated with the technology disclosed herein is provided to the consumer as so-called cloud services.

In cloud services, services are provided by servers arranged on networks. Cloud services are one from of computer usage based on the Internet. Basically, necessary processing operations are all executed on the server side. Each user stores data not in a personal computer, a smartphone, or a mobile phone of the user, but in a server on the Internet. This allows the user to execute the use of services and the browsing, editing, and uploading of data in various environments, such as own home, company office, Internet café, school, away-from-home, and so on for example.

1-4. Processing by the Electric Power Management Apparatus

Figure 7:
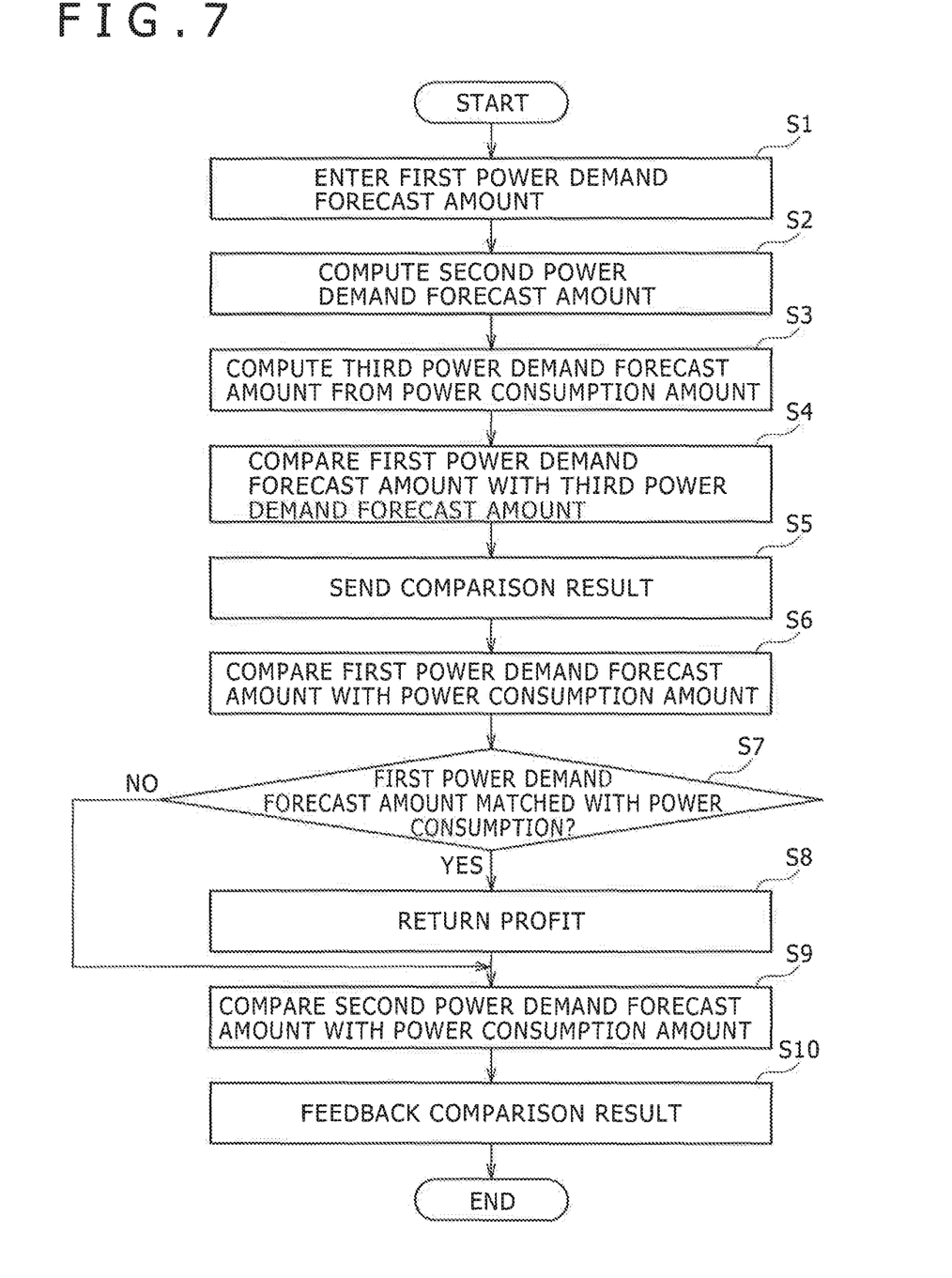
FIG. 7 is a flowchart of electric power management processing.

The following describes the processing to he executed in the HEMS 1000 having the electric power management apparatus 100. FIG. 7 shows a flowchart indicative of this processing.

First, in step S1, the demand forecast input block 120 receives a first electric. power demand forecast amount that is an electric power demand forecast amount in an input period. The first electric power demand forecast amount is entered by the consumer through the demand forecast input block 120. The entered first electric power demand forecast amount is transmitted to the electric power comparison block 160.

In addition, the entered first electric power demand forecast amount is transmitted to an electric power related utility for example through the communication block 302 for a spot transaction by the electric power related utility. Consequently, the electric power to be used by the consumer on the day of the transaction is secured. It should be noted that, because the first electric power demand forecast amount is used for a spot transaction, it is required to enter the first electric power demand forecast amount until the day of a spot transaction. For example, if, in a spot transaction, the electric power for 24 hours is traded the next day, namely, this electric power is delivered the next day, the first electric power demand forecast amount must be entered 24 hours before the day of transaction at latest a If such an entry deadline is set, information thereof may be displayed on the display apparatus of the demand forecast input block 120 to notify the consumer thereof.

Next, in step S2, the electric power demand forecast block 150 computes a second electric power demand forecast amount that is an electric power demand forecast amount for a time zone other than the input period. It should be noted that step 1 and step 2 may be replaced in execution sequence. If the input period has been determined in advance, the electric power demand forecast block 150 may first compute a second electric power demand forecast amount and then the entry of a first electric power demand forecast amount by the consumer may be accepted.

In step S3, when it gets immediately before the input period of the very transaction day of a spot transaction, the electric power demand forecast block 150 computes a third electric power demand forecast amount for each time zone of the input period from the electric power consumption amounts so far, The computed third electric power demand forecast amount is supplied to the electric power comparison block 160.

In step S4, the electric power comparison block 160 makes a comparison between the first electric power demand forecast amount entered by the consumer and the third electric power demand forecast amount. In step S5, a comparison result obtained by the electric power comparison block 160 is transmitted to the consumer as a notification. This notification is executed by displaying a notification image on the display apparatus of the demand forecast input block 120, for example. Consequently, the consumer knows that it is possible that there will occur a difference between the first electric power demand forecast amount entered by the consumer and the actual electric power consumption amount.

In step S6, the electric power comparison block 160 makes a comparison between the first electric power demand forecast amount entered by the consumer and the actual electric power consumption amount obtained by the electric power measurement block 110. In step S7, if a match is found (Yes in step S7) between the first electric power demand forecast amount and the actual electric power consumption amount as a result of the comparison by the electric power comparison block 160, then the procedure goes to step S8. On the other hand, if no match is found (No in step S7) between the first electric Power demand forecast amount and the actual electric power consumption amount, then the procedure does to step S9.

In step S8, the return processing block 170 executes predetermined return processing on the consumer with the first electric power demand forecast amount matching the actual electric power consumption amount. It should be noted that, before the execution of the return processing, the information about the match between the first electric power demand forecast amount and the actual electric power consumption amount may he transmitted to the consumer.

If no match is found between the first electric power demand forecast amount and the actual electric power consumption amount, the procedure does not go to step S8, so that the return processing is not executed.

Next, in step S9, the electric power comparison block 160 makes a comparison between a second electric power demand forecast amount that is an electric power demand. forecast amount in a time zone other than the input period and the electric power consumption amount obtained from the electric power measurement block 110. Then, in step 810, a result of this comparison is fed. back from the electric power comparison block 100 to the electric power demand forecast block 150, As described above, in the technology disclosed herein, the consumer enters an electric power demand. forecast amount of the consumer and, if a match is found. between the entered electric power demand forecast amount and the actual electric power consumption amount, a predetermined profit is returned to that consumer. This configuration gives the consumer an incentive for matching an electric power demand forecast amount with an actual electric power consumption amount. Because the acquisition of electric power by an electric power trading is executed on the basis of an electric power demand forecast amount, the matching between an entered electric power demand forecast amount and an actual electric power consumption amount makes it unnecessary to secure electric power by executing an electric power transaction on the very day of transaction, resulting in the lowered cost of electric power acquisition.

2. Variations

While preferred embodiments of the present invention have been described using specific terms, such description is for illustrative purpose only, and it is to be understood that changes and variations may be made without departing from the spirit or scope of the following claims.

In the description done above, the electric power demand forecast block 150 forecasts electric power demands in time zones other than the input period. However, if a first electric power demand forecast amount has not been entered by the consumer, then the electric power demand forecast block 150 may execute electric power demand forecasting of the entire day of transaction. If an electric power demand forecast amount has not been entered by the consumer by the deadline, the electric power demand forecast block 150 obtains an electric power demand forecast amount of the entire day of transaction and transmits the obtained amount to an external electric power related utility for example. On the basis of this electric power demand forecast amount, electric power transactions are executed. Consequently, electric power transactions can be executed without hindrance.

In the above-mentioned embodiment, the consumer enters a first electric power demand forecast amount in a particular numerical value, However, the entering of electric power demand forecast amounts is not limited to this method. For example, the consumer may enter his or her behavior plan with which each electric power demand. forecast amount is entered. In order to realize this method, the electric power demand forecast block 150 holds, as a database, electric power demand forecast amounts corresponding to the behaviors of the consumer. Then, the consumer enters a time zone and behaviors to be executed in this time zone. For example, "12:00 to 17:00; outing," "17:00 to 18:00; prepare for dinner," "21:00 to 23:00; watch TV," and so on.

Relating the behavior plan entered by the consumer with electric power consumption amounts allows the computation of the electric power demand forecast amounts corresponding to the behaviors of the consumer. This configuration allows the user to enter electric power demand forecast amounts without making the consumer be aware of electric powers that are particular values.

In the above description, the management server 200 has the electric power demand forecast block 150 and the electric power comparison block 160 to execute electric power demand. forecasting and electric power comparison on the side of the management server 200. However, it is also practicable for a forecasting target side such as a home to have the electric power demand forecast block 150 and the electric power comparison block 160 to execute forecasting processing and comparison processing at the forecasting target side, transmitting the results of these processing operations to the management server. In addition, it is also practicable for an electric power company or an electric power retailer included in the electric power related utility to have the electric power management apparatus 100, thereby executing electric power demand forecasting at the side of the electric power related utility.

It should be noted that the technology disclosed herein may take the following configuration.

(1) An electric power management apparatus including:
an electric power measurement block configured to measure an electric power consumption amount of an electric power consumer; and
an electric bower comparison block configured to make a comparison between an electric power consumption amount measured by the electric power measurement block and an electric power demand forecast amount indicative of a forecast amount of an electric power demand of the electric power consumer.

(2) The electric power management apparatus according to (1) above, further including
an input block configured to receive an input from the electric power consumer;
wherein the electric power demand forecast amount is entered by the electric power consumer through the input block.

(3) The electric power management apparatus according to (1) or (2) above, still further including
a return processing block configured to return a profit to the electric power consumer on the basis of a comparison result obtained through the electric power comparison block.

(4) The electric power management apparatus according to any one of (1) through (3) above, yet further including
an electric power demand forecasting block configured to compute the electric power demand forecast amount.

(5) The electric power management apparatus according to any one of (1) through (4) above, wherein
the electric power demand forecasting block computes the electric power demand forecast amount by use of a predetermined learning algorithm and
the a comparison result obtained through the electric power comparison block is supplied to the electric power demand forecasting block for use in the predetermined learning algorithm.

(6) The electric power management apparatus according to any one of (1) through (5) above, including:
an input block configured to receive the input of the electric power demand forecast amount in a predetermined period by the electric power consumer; and
an electric power demand forecasting block configured to compute the electric power demand forecast amount in the predetermined period;
wherein the electric power comparison block makes a comparison between the electric power demand forecast amount entered by the electric power consumer and the electric power demand forecast amount obtained by the electric power demand forecasting block.

(7) The electric power management apparatus according to (6) above, wherein
the input block receives the input of a numeric value indicative of the electric power demand forecast amount in each of predetermined sections making up the predetermined period;
the electric power demand forecasting block computes the electric power demand forecast amount for each of the predetermined. sections; and
the electric power comparison block makes a comparison between the electric power demand forecast amount entered by the electric power consumer and the electric power demand forecast amount obtained through the electric power demand forecasting block for each of the predetermined sections.

(8) The electric power management apparatus according to any one of (1) through (7) above, further including
a notification block configured to notify the electric power consumer of a comparison result obtained through the electric power comparison block.

(9) The electric power management apparatus according to any one of (1) through (8) above, still further including
an input block configured to receive an input from the electric power consumer,
wherein the electric power demand forecast amount is obtained on the basis of a behavior plan of the electric power consumer entered by the electric power consumer through the input block.

(10) An electric power management method including:
measuring an electric power consumption amount of an electric power consumer; and
comparing a measured electric power consumption amount with an electric power demand forecast amount.

The present disclosure contains subject matter related to that disclosed in Japanese Priority Patent Application JP 2011-251243 filed in the Japan Patent Office on Nov. 17, 2011, the entire content of which is hereby incorporated. by reference.

It should be understood by Those skilled in the art that various modifications, combinations, sub-combinations and alterations may occur depending on design requirements and other factors in so fax as they are within the scope of the appended claims or the equivalents thereof.

What is claimed is:

1. An electric power management apparatus comprising:
an electric power measurement block configured to measure an electric power consumption amount of electric devices used by an electric power consumer;
a demand forecast input block configured to receive input of a first electric power demand forecast amount from the electric power consumer for an input target period;
an electric power demand forecast block configured to calculate another electric power demand forecast amount based on a rate of change of the electric power consumption amount until the input target period; and
an electric power comparison block configured to make a comparison between the first electric power demand forecast amount and the other electric power demand forecast amount.

2. The electric power management apparatus according to claim 1, wherein the input target period is of a transaction target day on which electric power is delivered to the electric devices used by the electric power consumer.

3. The electric power management apparatus according to claim 1, further comprising a return processing block configured to determine a profit to be returned to the electric power consumer based on the comparison of the first electric power demand forecast amount and the other electric power demand forecast amount.

4. The electric power management apparatus according to claim 1, wherein the other electric power demand forecast amount is based on the rate of change of the electric power consumption amount in a transaction target day on which electric power is delivered to the electric devices until the input target period.

5. The electric power management apparatus according to claim 1, wherein the electric power demand forecast block is configured to compute the other electric power demand forecast amount by use of a predetermined learning algorithm.

6. The electric power management apparatus according to claim 1, wherein the demand forecast input block is configured to receive input of numeric values of the first electric power demand forecast amount for each of one or more predetermined sections making up the input target period, and wherein the electric power comparison block is configured to make a comparison between the first electric power demand forecast amount entered by the electric power consumer for each of the one or more predetermined sections and the other electric power demand forecast amount.

7. The electric power management apparatus according to claim 1, further comprising a notification block configured to notify the electric power consumer of a comparison result obtained through the electric power comparison block.

8. The electric power management apparatus according to claim 1, wherein the first electric power demand forecast amount is obtained based on a behavior plan of the electric power consumer entered by the electric power consumer through the input block.

9. An electric power management method comprising:
in an electric power management apparatus:
measuring an electric power consumption amount of electric devices used by an electric power consumer;
receiving input of a first electric power demand forecast amount from the electric power consumer for an input target period;
calculating another electric power demand forecast amount based on a rate of change of the electric power consumption amount until the input target period; and
comparing the first electric power demand forecast amount and the other electric power demand forecast amount.

* * * * *